United States Patent
Chen

(10) Patent No.: US 7,297,991 B2
(45) Date of Patent: *Nov. 20, 2007

(54) BIPOLAR JUNCTION TRANSISTOR AND FABRICATING METHOD

(75) Inventor: Anchor Chen, Ping-Tung (TW)

(73) Assignee: United Microelectronics Corp., Hsin-Chu (TW)

( * ) Notice: Subject to any disclaimer, the term of this patent is extended or adjusted under 35 U.S.C. 154(b) by 229 days.

This patent is subject to a terminal disclaimer.

(21) Appl. No.: 10/709,568

(22) Filed: May 14, 2004

(65) Prior Publication Data

US 2004/0227213 A1  Nov. 18, 2004

Related U.S. Application Data

(63) Continuation-in-part of application No. 10/064,051, filed on Jun. 5, 2002, now Pat. No. 6,759,731.

(51) Int. Cl.
 H01L 31/0328 (2006.01)
 H01L 31/0336 (2006.01)
 H01L 31/11 (2006.01)
 H01L 27/082 (2006.01)
 H01L 27/102 (2006.01)

(52) U.S. Cl. .............. 257/183; 257/197; 257/593; 257/588

(58) Field of Classification Search ............ 257/183, 257/197, 198, 593, 588, 565
See application file for complete search history.

(56) References Cited

U.S. PATENT DOCUMENTS

| 4,800,176 A * | 1/1989 | Kakumu et al. ............. 438/626 |
| 6,759,731 B2 * | 7/2004 | Chen ........................ 257/592 |
| 2003/0096486 A1 * | 5/2003 | Chuang et al. ............. 438/309 |

FOREIGN PATENT DOCUMENTS

WO   WO 98/57367   12/1998

* cited by examiner

Primary Examiner—Chuong A. Luu
(74) Attorney, Agent, or Firm—Winston Hsu

(57) ABSTRACT

A bipolar junction transistor includes a dielectric layer formed on a predetermined region of a substrate, an opening formed in the dielectric layer and a portion of the substrate being exposed, a semiconductor layer formed on a sidewall and a bottom of the opening and on a portion of the dielectric layer outside the opening, a spacer formed on the semiconductor layer to define a self-aligned emitter region in the opening, an emitter conductivity layer being filled with the self-aligned emitter region and a PN junction being formed between the emitter conductivity layer and the semiconductor layer, and a salicide layer formed on the emitter conductivity layer and on the portion of the semiconductor layer extending outside the opening.

27 Claims, 13 Drawing Sheets

BIPOLAR JUNCTION TRANSISTOR AND FABRICATING METHOD

CROSS REFERENCE TO RELATED APPLICATIONS

This is a continuation-in-part of U.S. patent application Ser. No. 10/064,051, filed on Jun. 5, 2002, now U.S. Pat. No. 6,759,731, and which is included herein by reference.

BACKGROUND OF INVENTION

1. Field of the Invention

The present invention relates to a bipolar junction transistor (BJT) and its fabricating method, and more particularly, to a self-aligned BJT and a self-aligned method for producing the same.

2. Description of the Prior Art

A bipolar junction transistor utilizes two type of carriers, "electrons" and "hot holes", to transmit current. The BJT continues to be a basic circuit element in integrated circuits due to its high switching capability and current carrying capacity. However, the electrons/holes mobility of a silicon BJT, which has a silicon substrate, is lower and not suitable for being applied in high frequency devices. Therefore, the silicon BJT has been replaced with a GaAs BJT, which has a GaAs substrate, or a SiGe hetero-junction bipolar transistor (HBT) in recently semiconductor processes.

Please refer to FIG. 1 to FIG. 5, which are schematic diagrams illustrating a conventional method for forming a silicon BJT. As shown in FIG. 1, the silicon BJT is formed on a P-type single crystal silicon substrate 10 including a heavily doped N type (N$^+$) region 12 and heavily doped P type (P$^+$) regions 14 formed on the substrate 10. First, an N-epitaxial layer 16 is thermally grown on the substrate 10, which has a thickness of about 1.2 micrometers (μm). During formation of the epitaxial layer 16, dopants of the N$^+$ region 12 and the P$^+$ region 14 diffuse upward into the epitaxial layer 16. Then, a silicon dioxide layer 18 and a silicon nitride layer 20 are formed on the epitaxial layer 16, respectively. A photolithographic and etching process is performed to remove a portion of the silicon nitride layer 20, the silicon dioxide layer 18 and the epitaxial layer 16 to expose a portion of the epitaxial layer 16, thus forming a plurality of openings 22 in the silicon nitride layer 20, the silicon dioxide layer 18, and the epitaxial layer 16.

As shown in FIG. 2, a thermal growth process is performed to oxidize the exposed epitaxial layer 16 to an oxide layer 24, which fills in the opening 22, with a top surface of the oxide layer 24 being approximately equal to a top surface of silicon dioxide layer 18. After that, the remained silicon nitride layer 20 is removed. During thermal growth of the oxide layer 24, the dopants of the N$^+$ region 12 and the P$^+$ region 14 are diffused further upward to broaden the N$^+$ region 12 and P$^+$ region 14. Afterwards, a photoresist layer 26 is deposited on the oxide layer 24, and the photoresist layer 26 is exposed and developed to form an opening 27 in the photoresist layer 26. Then, suitable N-type dopants, such as phosphorus (P), are ion implanted through the opening 27 to form an N$^+$ collector region 28 within the epitaxial layer 16 and beneath the oxide layer 24.

As shown in FIG. 3, the remnant photoresist layer 26 is removed and another patterned photoresist layer (not shown in FIG. 3) is formed on the oxide layer 24. A wet etching process or a reactive ion etching (RIE) process is performed to remove a portion of the oxide layer 24 above the epitaxial layer 16, thus forming an opening 30 in the oxide layer 24.

Then, a P-polysilicon layer 32 and a silicon dioxide layer 34 are formed on the substrate 10, respectively. Typically, the polysilicon layer 32 has a thickness of about 8000 angstroms (Å), and the silicon dioxide layer 34 has a thickness of about 5000 to 6000 Å. A patterned photoresist layer (not shown in FIG. 3) is formed on the silicon oxide layer 34, and a photolithographic and etching process is performed to remove a portion of the silicon dioxide layer 34 and the polysilicon layer 32 to form an opening 36 in the silicon dioxide layer 34 and the polysilicon layer 32, and a portion of the epitaxial layer 16 is exposed.

As shown in FIG. 4, a silicon dioxide layer 38 is thermally grown on the substrate 10 that covers a bottom and a sidewall of the opening 36 uniformly. Typically, the silicon dioxide layer 38 has a thickness of between 0.2 to 0.4 μm. During formation of the silicon dioxide layer 38, P-type dopants of the polysilicon layer 32 diffuse downwards into the N-epitaxial layer 16 to form P-extrinsic base regions 40 within the epitaxial layer 16. Then, a directional RIE process is performed to remove a portion of the silicon dioxide layer 38 in the bottom of the opening 36 and on the oxide layer 24. Further, a relatively low-energy, high-dose ion implantation is performed to form an N shallow emitter region 42 within the epitaxial layer 16, which has a thickness of about 0.2 μm, by implanting the arsenic (As) ions through the opening 36 into the epitaxial layer 16. Similarly, a relatively high-energy, high-dose ion implantation is performed to form an N$^+$ raised subcollector 44, which has a thickness of about 0.2 micrometers, by implanting phosphorus (P) ions through the opening 36 into the epitaxial layer 16. The energy and heat cycling conditions for the phosphorus implantation are selected such that the bottom of the raised subcollector 44 nominally submerges into the N$^+$ region 12. And a relatively middle-energy, low-dose boron ion implantation is performed to form an intrinsic base region 46 beneath the shallow emitter region 42 and above the raised subcollector 44, by implanting the As ions through the opening 36 into the epitaxial layer 16.

Finally, as shown in FIG. 5, a photolithographic and etching process is performed to form two contact vias (not shown in FIG. 5) on the polysilicon layer 32 and the collector region 28. Then, a metal layer is filled in the contact vias and the opening 36 to form three metal contacts 50, 52, and 48, and the conventional BJT is completed.

As stated above, the conventional method for forming the BJT is very complicated. Although the intrinsic base region 46 and the emitter region 42 of the BJT are formed by the self-aligned method, the extrinsic base regions 40 are formed by the thermal diffusion process. So that the contact area between the intrinsic base region, the extrinsic base region and the collector region cannot be controlled precisely. Thus causing higher capacitance between the base region and the collector region and the conventional BJT is not suitable for being applied in high frequency devices. In addition, the interference of the PN junction of the BJT is clearer, the performance of the device is better. However while the SiGe HBT can function in high temperatures, the interference between the SiGe epitaxial layer and silicon of the SiGe HBT will generate a plurality of intersectional arrangements and thus destroy the its high speed characteristic. For this reason, the temperature for forming the SiGe epitaxial layer has to be controlled to be below 700° C. But the conventional BJT has to utilize the thermal diffusion process many times, and therefore the conventional method is not suitable for forming the HBT.

SUMMARY OF INVENTION

It is therefore a primary objective of the claimed invention to provide a method for forming a PN junction of a self-aligned bipolar junction transistor (BJT).

It is another object of the claimed invention to provide a self-aligned hetero-junction bipolar transistor (HBT), which is suitable for being applied in high frequency devices.

According to the claimed invention, a bipolar junction transistor includes a dielectric layer formed on a substrate, an opening formed in the dielectric layer to expose a portion of the substrate, a semiconductor layer formed on a sidewall and a bottom of the opening, the semiconductor layer extending outside the opening and above the dielectric layer, a spacer formed on the semiconductor layer to define a self-aligned emitter region in the opening, an emitter conductivity layer being filled with the self-aligned emitter region and a PN junction being formed between the emitter conductivity layer and the semiconductor layer, and a salicide layer formed on the emitter conductivity layer and on the portion of the semiconductor layer extending outside the opening and above the dielectric layer.

The claimed invention utilizes the semiconductor layer to form an intrinsic base region in the opening, and utilizes the spacer formed on the semiconductor layer to define the self-aligned emitter region in the opening. Accordingly, only one opening has to be formed, so that the emitter, the base, and the collector of the BJT can be formed with small size and high efficiency by using the self-aligned method of the claimed invention.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
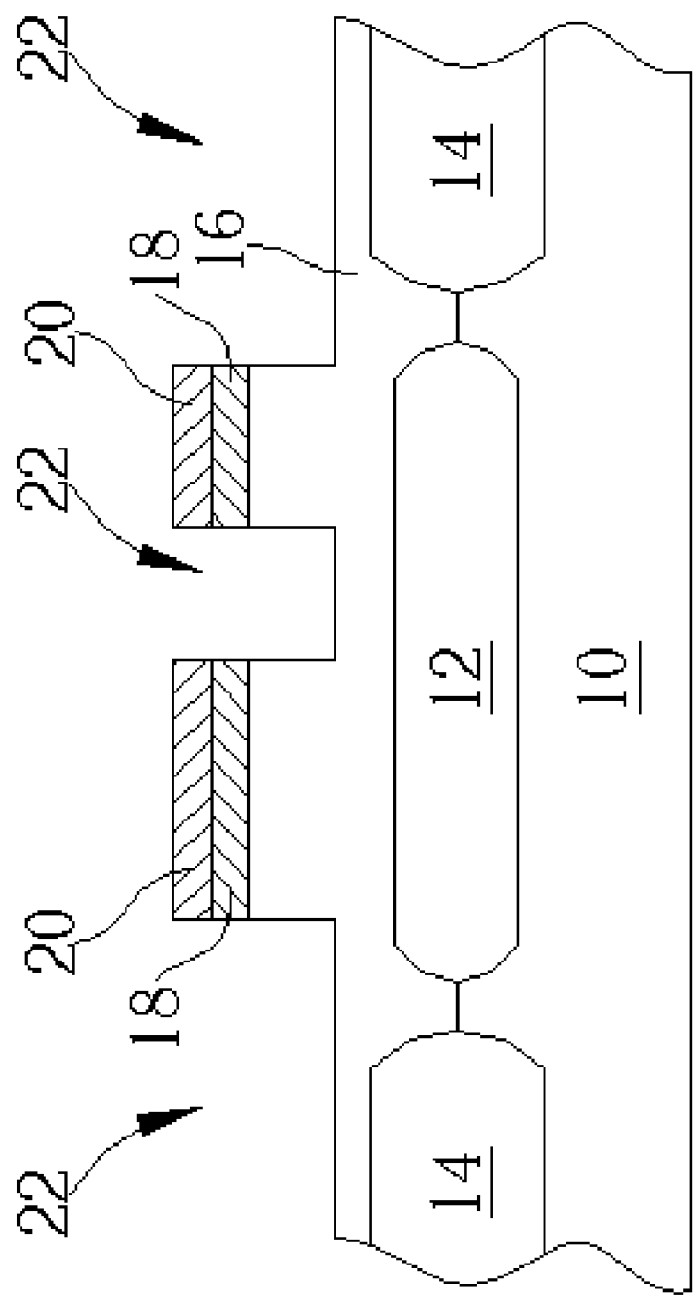
FIG. 1 to FIG. 5 are schematic diagrams illustrating a conventional method for forming a bipolar junction transistor (BJT).
Figure 2:
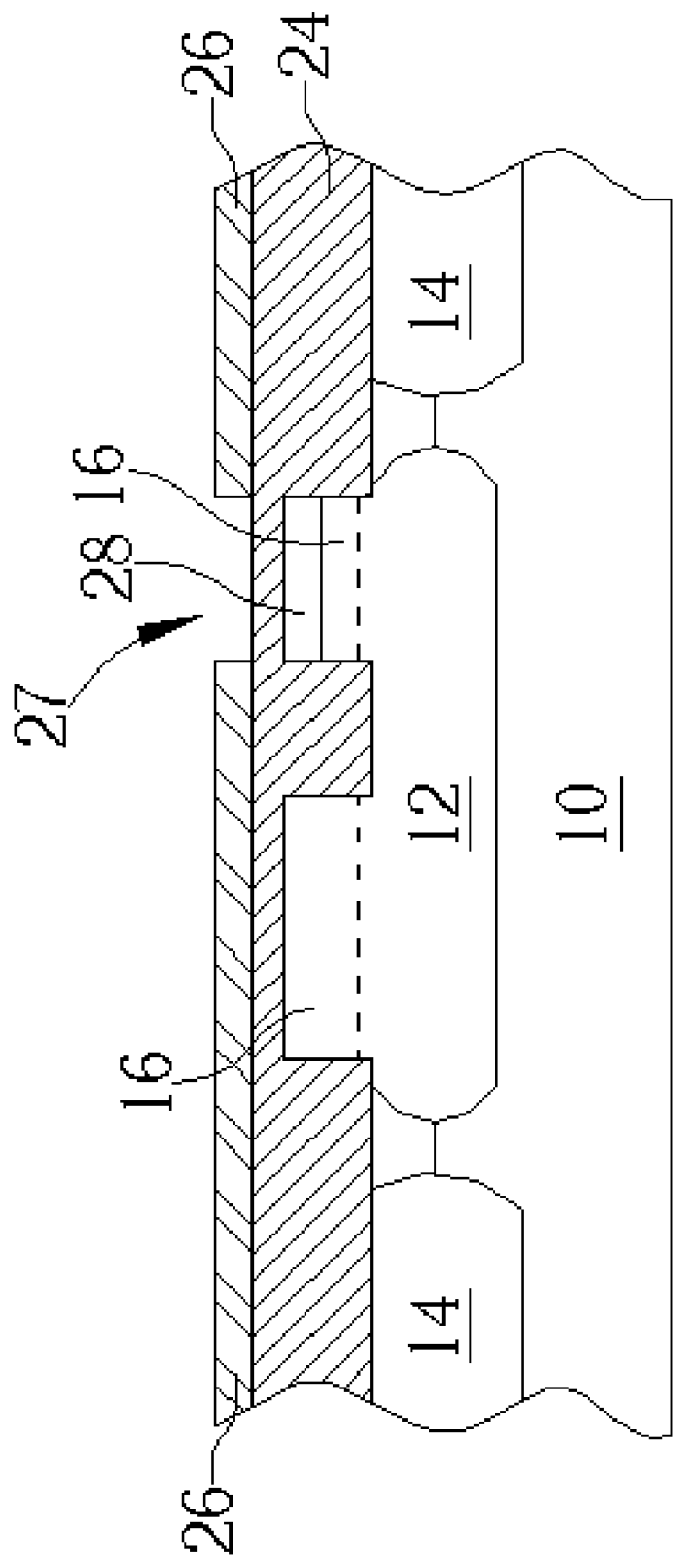
Figure 3:
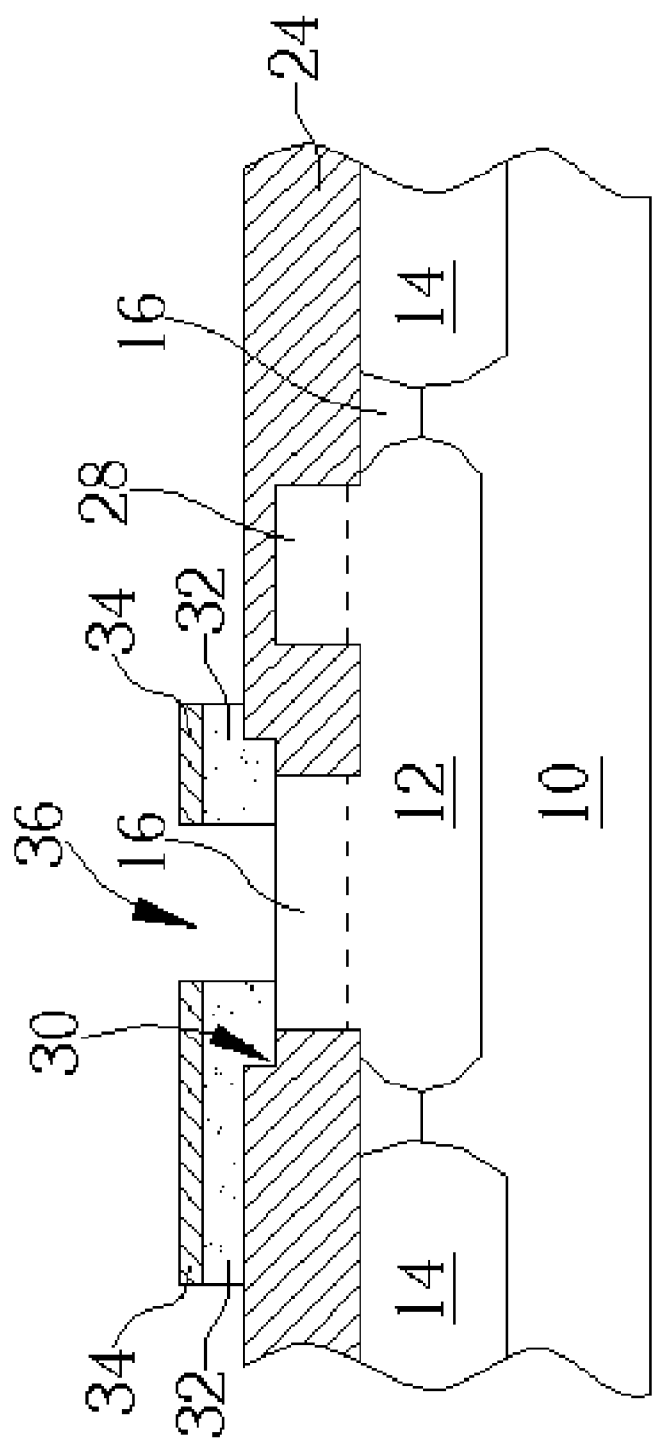
Figure 4:
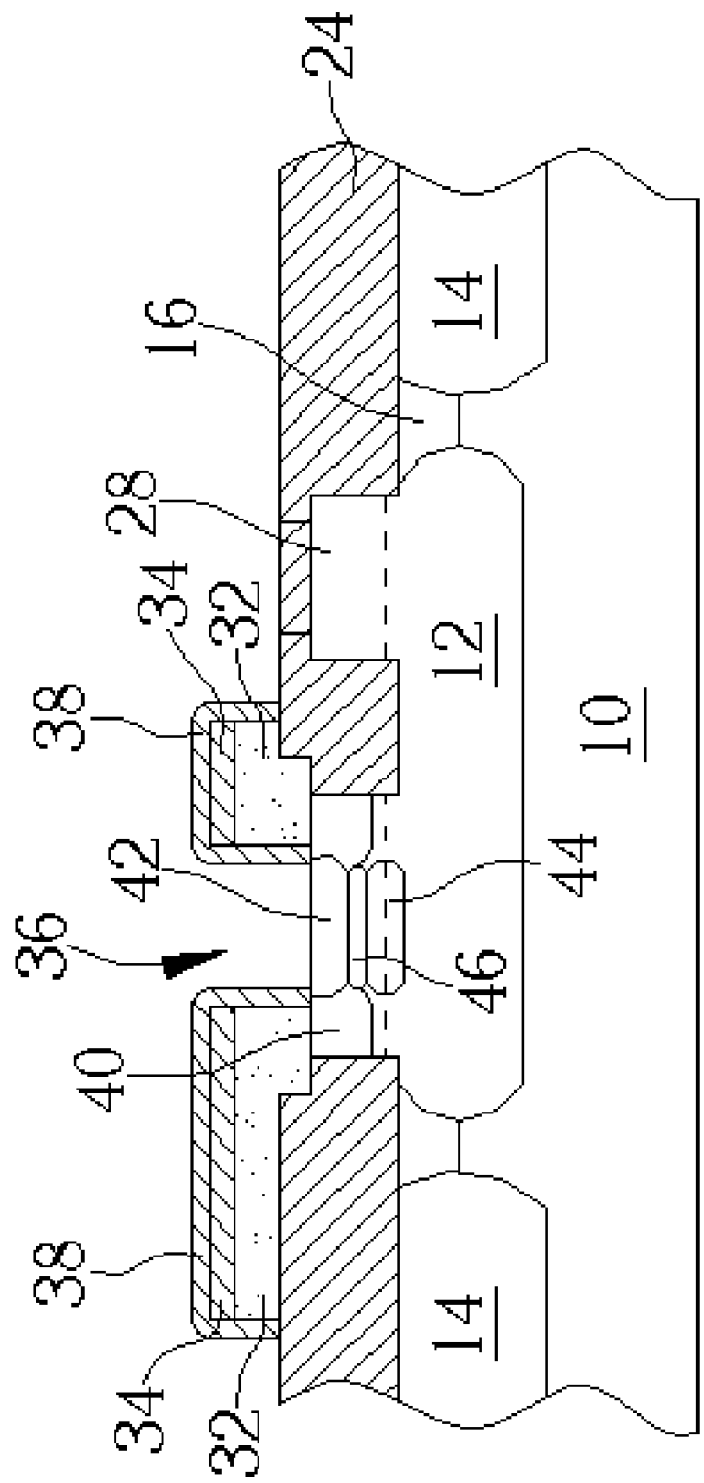
Figure 5:
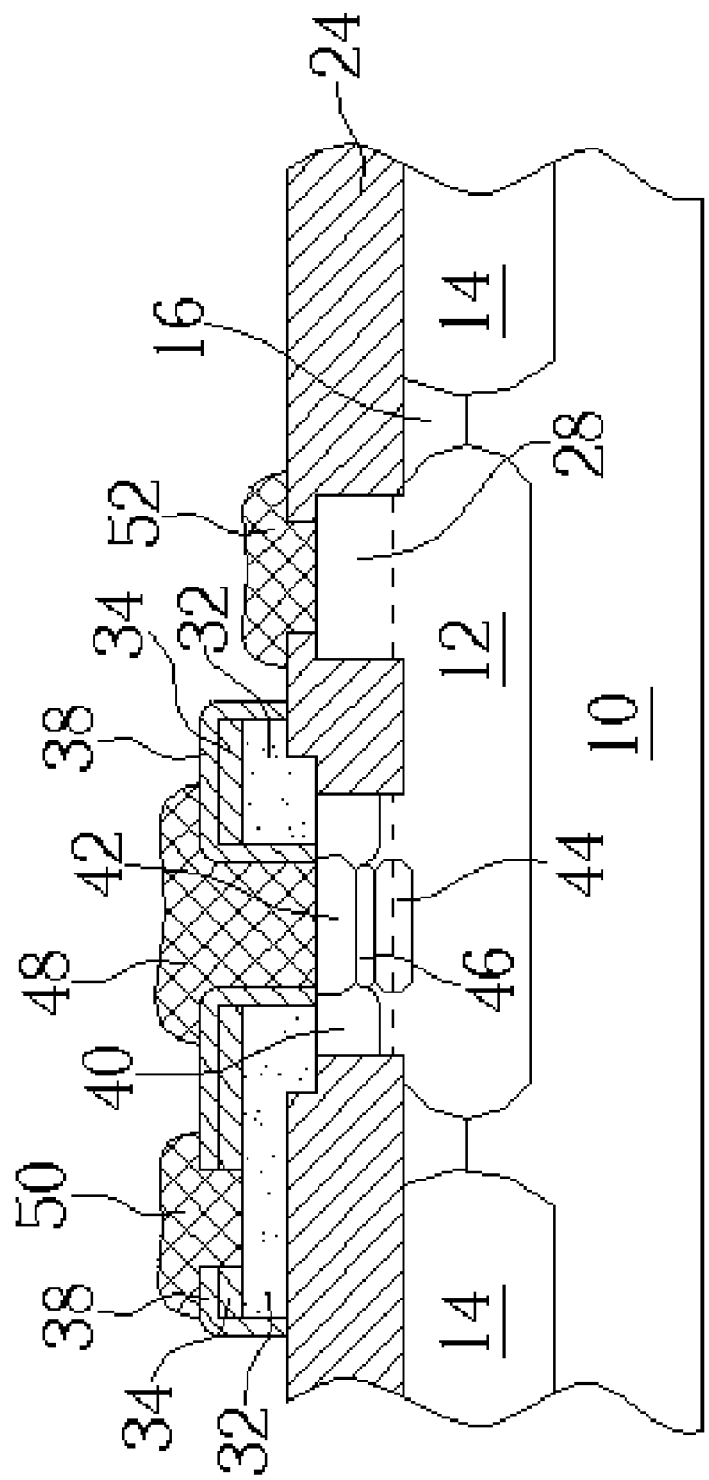
Figure 6:
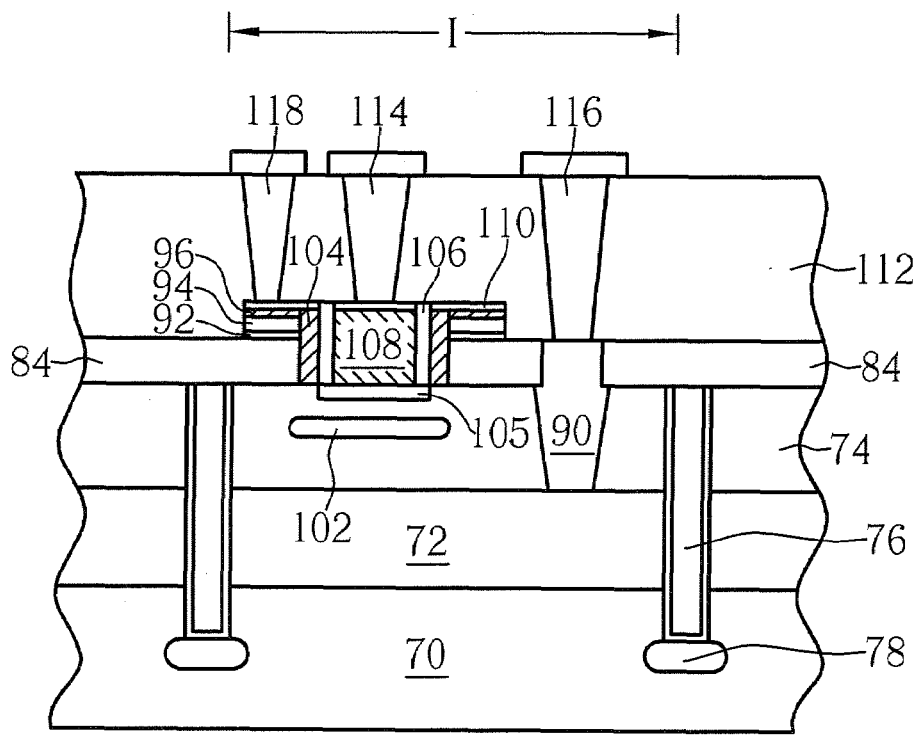
FIG. 6 is a cross-sectional diagram illustrating a self-aligned BJT according to the present invention.

Please refer to FIG. 6, which is a cross-sectional diagram illustrating a self-aligned bipolar junction transistor (BJT) according to the present invention. The BJT is formed within an active region I of a semiconductor substrate 70 including an $N^+$ buried layer 72 and an N-type nonselective epitaxial layer 74 formed on the substrate 70, respectively. A deep isolation trench 76 and a heavily doped channel stop region 78 are formed deep in the substrate 70 so as to electrically insulate and isolate each of the active regions 1. A dielectric layer 84 is formed on a predetermined region of the substrate 70, and an opening (not shown in FIG. 6) is formed in the dielectric layer 84 to expose a portion of the epitaxial layer 74. Further, a heavily doped polysilicon layer 104 is formed on a side-wall of the opening to define a self-aligned base region in the opening, and an intrinsic base doped region 105 is formed within the epitaxial layer 74 and in a bottom of the opening by implanting through the self-aligned base region. Then, a spacer 106 is formed on the heavily doped polysilicon layer 104 to define a self-aligned emitter region in the opening, and an emitter conductivity layer 108 is filled with the self-aligned emitter region, and thus a PN junction is formed between the emitter conductivity layer 108 and the intrinsic base doped region 105.

Figure 7:
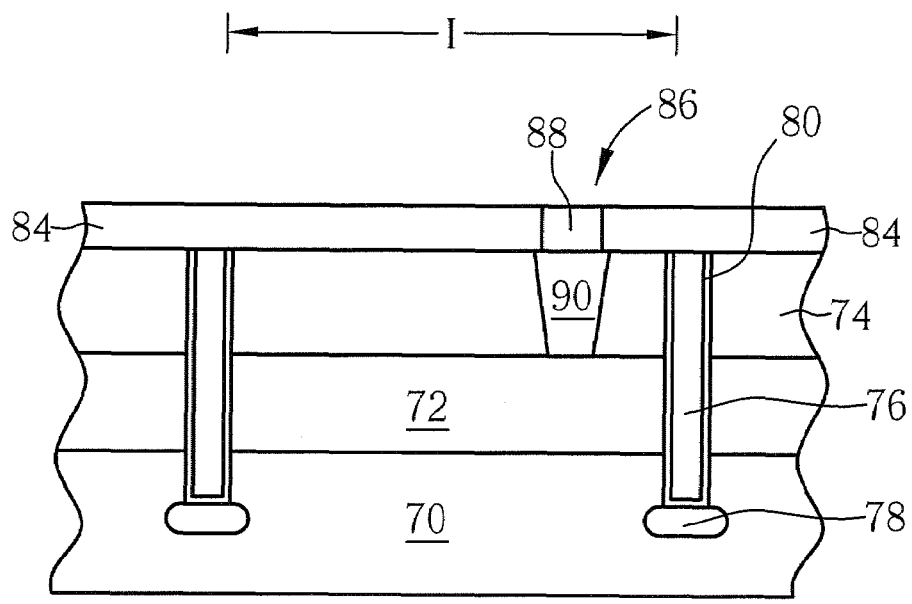
FIG. 7 to FIG. 11 are schematic diagrams illustrating a self-aligned method for forming the BJT according to the first embodiment of the present invention.

Please refer to FIG. 7 to FIG. 11, which are schematic diagrams illustrating a method for forming a PN junction of the BJT according to the first embodiment of the present invention. As shown in FIG. 7, the BJT of the present invention is fabricated on a P-type semiconductor substrate 70 having an active region 1. An $N^+$ buried layer 72 and an N-type non-selective epitaxial layer 74 are formed on the substrate 70, respectively. First, a deep isolation trench 76 is formed surrounding the active region I, and the deep isolation trench 76 passes through the epitaxial layer 74, the buried layer 72, and downwards into the substrate 70. Then, a dosage of approximately 1E13 atoms/cm² boron (B) ions is implanted into the deep isolation trench 76 to form a $P^+$ channel stop region 78 in the bottom of the deep isolation trench 76. An insulating layer 80 is formed on a sidewall and a bottom of the deep isolation trench 76, and a silicon dioxide layer or an undoped polysilicon layer 82 is filled with the deep isolation trench 76 to form a deep trench isolation. The insulating layer 80 is composed of a thermal oxide layer and a nitride layer.

Then, a dielectric layer 84 is formed on the epitaxial layer 74. For example, a thermal oxidation process is performed on the epitaxial layer 74 to form a silicon dioxide layer, which has a thickness of approximately 5000 angstroms (Å). Then, a photoresist layer (not shown in FIG. 7) is formed on the dielectric layer 84, and a photolithographic and etching process is performed to form a collector contact hole 86. After removing the photoresist layer, a low pressure chemical vapor deposition (LPCVD) process is performed to deposit an undoped polysilicon layer 88 on the dielectric layer 84, and then an etching process is performed to remove a portion of the dielectric layer 84 to fill the collector contact hole 86 with the undoped polysilicon layer 88. Typically, the undoped polysilicon layer 88 has a thickness of about 2500 Å. Then, a patterned photoresist layer (not shown in FIG. 7) is formed on the dielectric layer 84 to define an $N^+$ collector contact region, and a dosage of about 5E15 atoms/cm² phosphorus (P) ions is implanted into the exposed undoped polysilicon layer 88, and a thermal treatment process is performed to drive the P ions into the epitaxial layer 74 to form an $N^+$ collector contact region 90 beneath the undoped polysilicon layer 88. So that a portion of the undoped polysilicon layer 88 is doped with N-type dopants, and then the photoresist layer is removed. In addition, a PN non-rectifying junction is formed between the collector contact region 90 and the buried layer 72.

Figure 8:
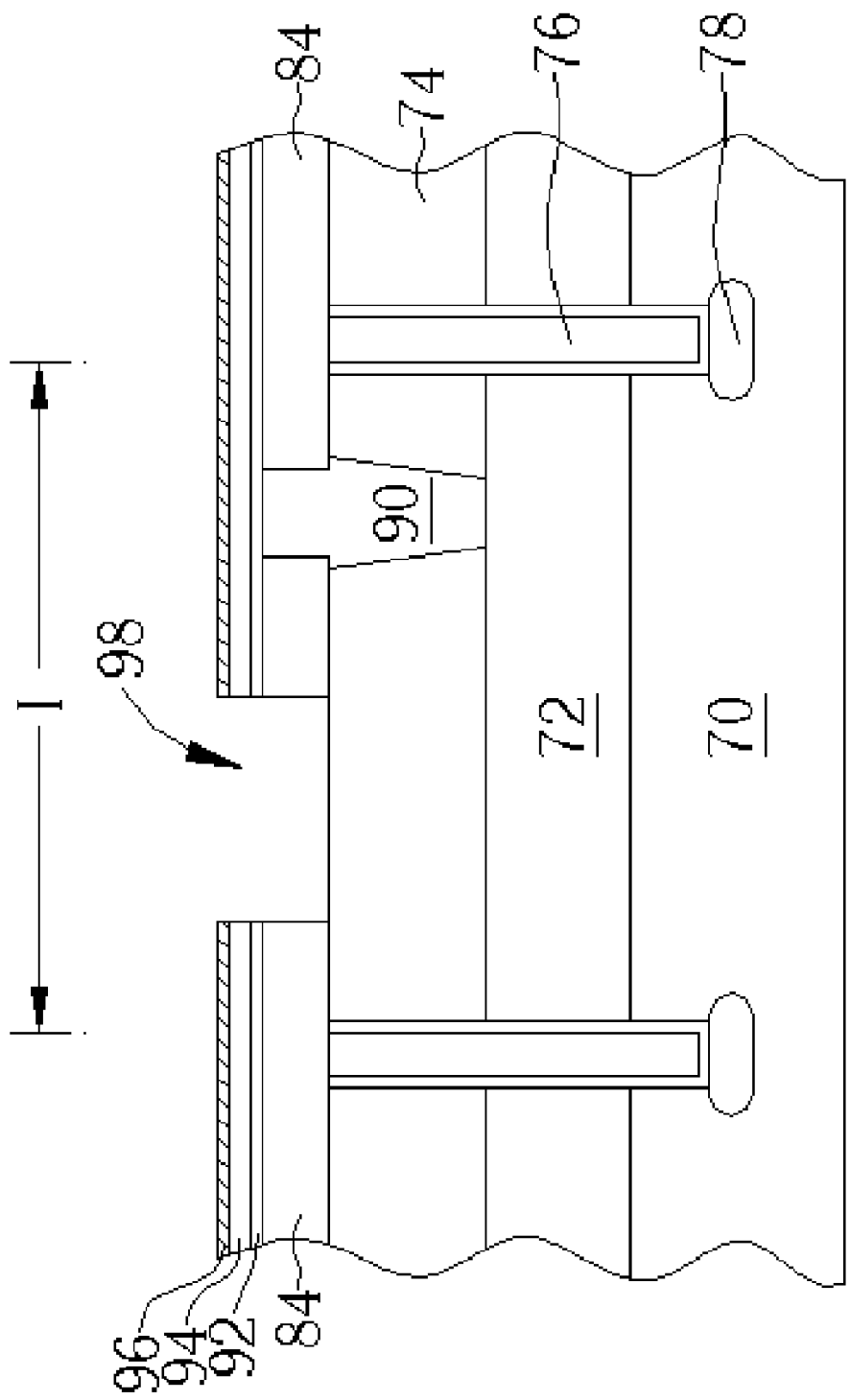

As shown in FIG. 8, a thermal growth process or a CVD process is performed to form a silicon dioxide layer 92, which has a thickness of about 1300 Å, on the dielectric layer 84. Then, a silicon nitride layer 94 and an in-situ doped P-type polysilicon layer 96 are formed on the silicon dioxide layer 92, respectively. Further, a patterned photoresist layer (not shown in FIG. 8) is formed on the polysilicon layer 96, and a photolithographic and etching process is performed to form an opening 98 in the polysilicon layer 96, the silicon nitride layer 94, the silicon oxide layer 92, and the dielectric layer 84, and a portion of the epitaxial layer 74 is exposed.

The in-situ doped P-type polysilicon layer 96 is used as an extrinsic base of the BJT for controlling the electrode voltage of the BJT.

Figure 9:
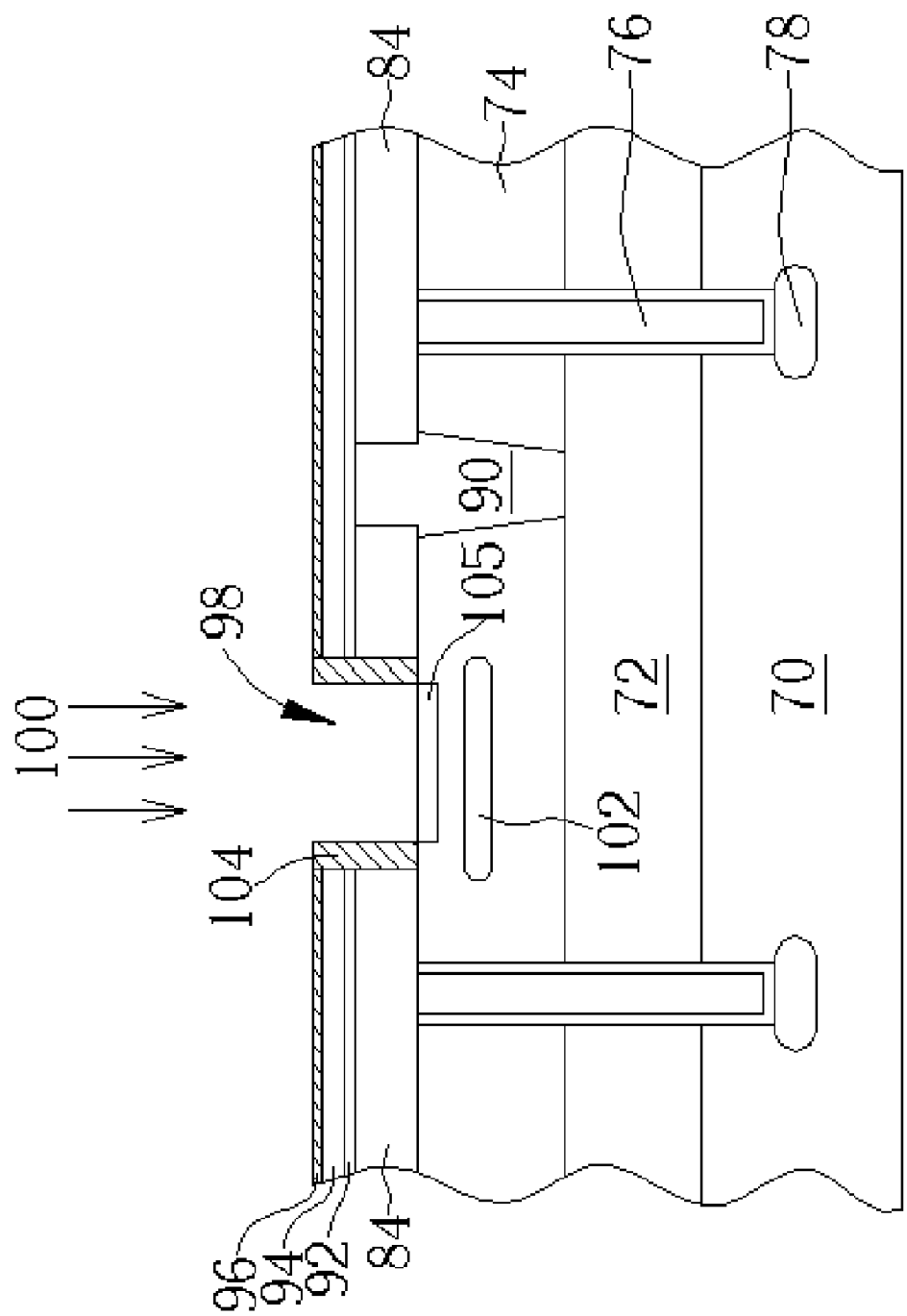

As shown in FIG. 9, a selective ion implantation process 100 is performed to form a selective implant collector (SIC) 102 in the exposed epitaxial layer 74 and at a bottom of the opening 98. After that, a P+ polysilicon layer (not shown in FIG. 9) is deposited on the substrate 70 that covers a sidewall and the bottom of the opening 98. The P+ polysilicon layer is doped with B ions with a dosage ranging from 1E19 to 1E20 atoms/cm$^2$. Further, an etching back process is performed to remove a portion of the polysilicon layer to expose the epitaxial layer 74 in the bottom of the opening 98, and the residual polysilicon layer 104 is formed on the sidewall of the opening 98 to define a self-aligned base region in the opening 98. After that, a dosage of about 5E15 atoms/cm$^2$ B ions is implanted through the self-aligned base region to form a P-type intrinsic base doped region 105 within the epitaxial layer 74 and in the bottom of the opening 98.

Figure 10:
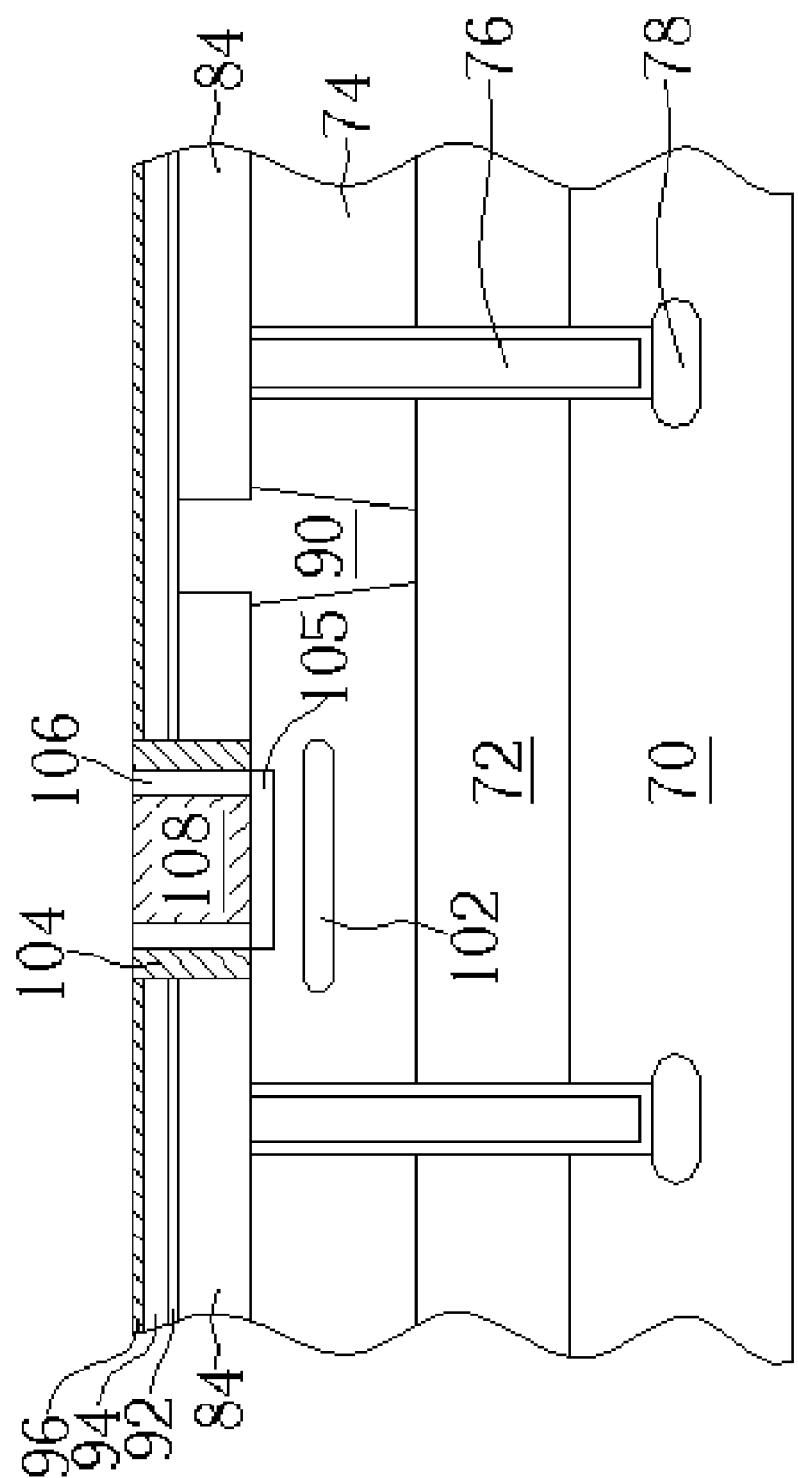

As shown in FIG. 10, an oxide layer (not shown in FIG. 10) is formed on the substrate 70 uniformly, and an etching back process is performed to remove a portion of the oxide layer to expose a portion of the epitaxial layer 74 in the bottom of the opening 98, so that the remnant oxide layer on the polysilicon layer 104 is used as a spacer 106, and the spacer 106 defines a self-aligned emitter region in the opening 98. Then, an emitter conductivity layer 108 is filled with the self-aligned emitter region, and a PN junction is formed between the emitter conductivity layer 108 and the intrinsic base doped region 105.

Figure 11:
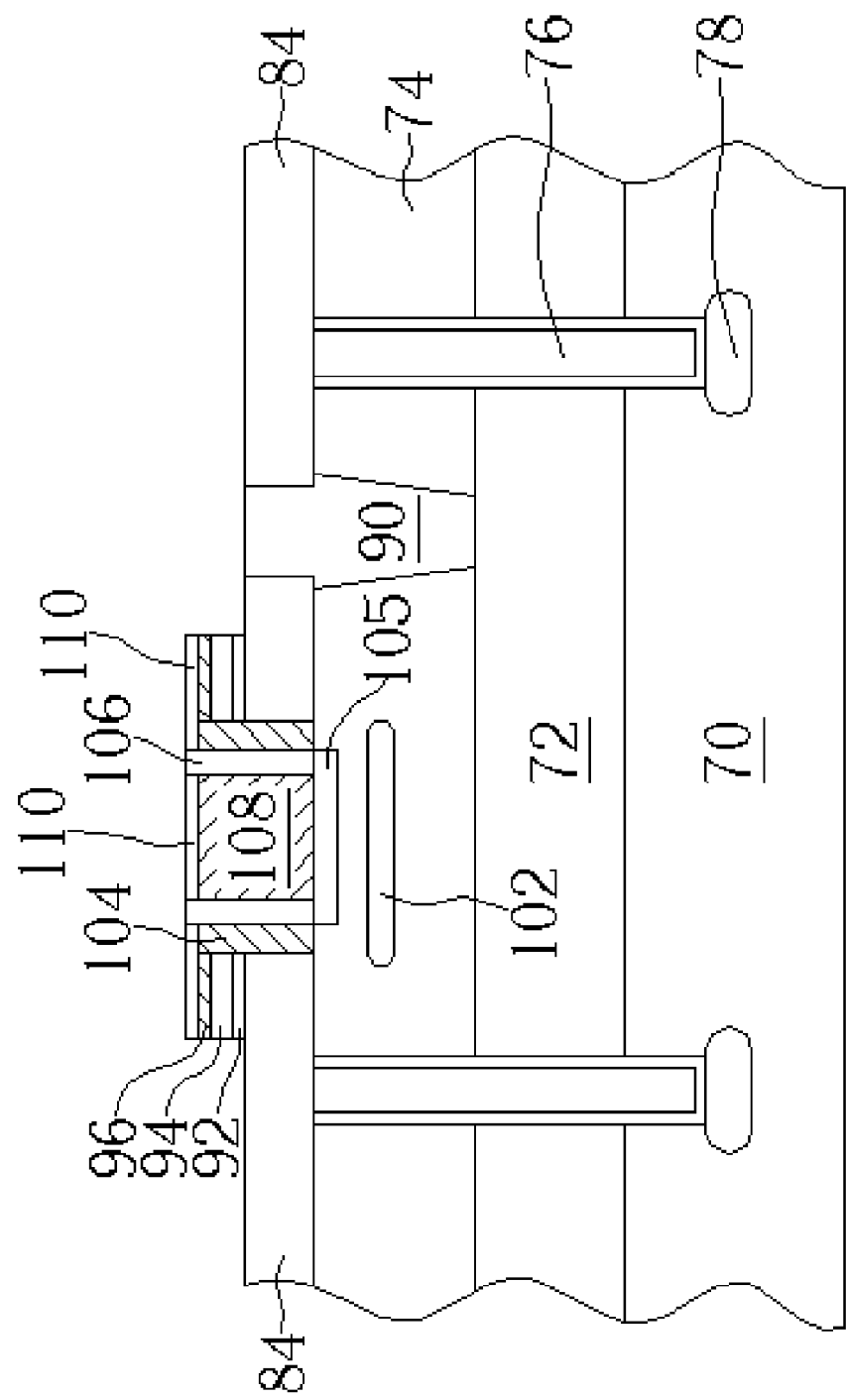

As shown in FIG. 11, an etching back process is performed to remove a portion of the emitter conductivity layer 108. Then, a photolithographic and etching process is performed to pattern the polysilicon layer 96, and another etching back process is performed to remove a portion of the silicon nitride layer 94 and the oxide layer 92. Further, a self-aligned silicide (salicide) layer 110 is formed on the emitter conductivity layer 108 and the patterned polysilicon layer 96. Finally, an interlayer dielectric layer 112 is formed on the substrate 70, and a metal contact is formed on the emitter conductivity layer 108, the collector contact region 90 and the extrinsic base region, as shown in FIG. 6, and the self-aligned BJT of the present invention is completed.

Figure 12:
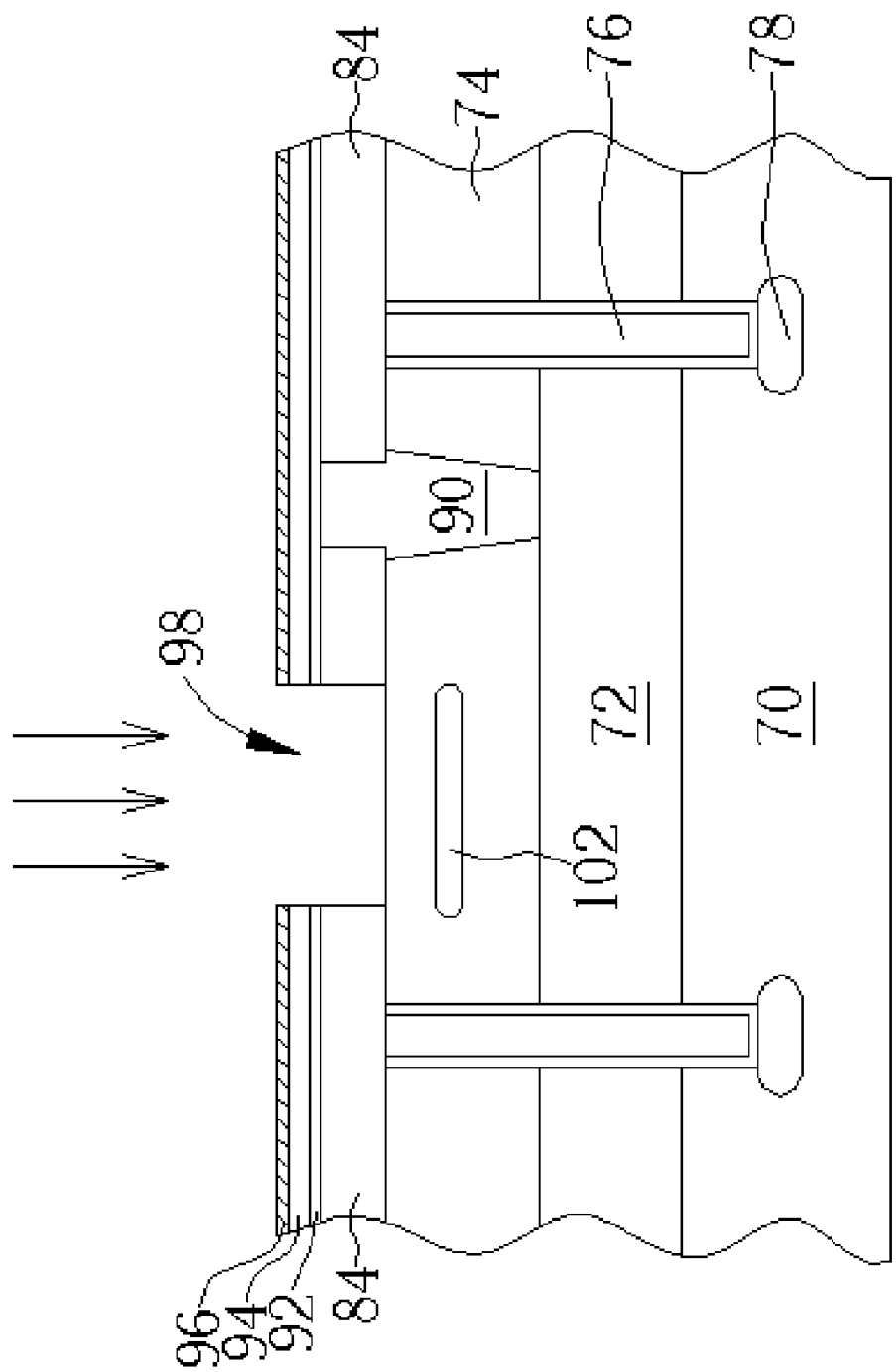
FIG. 12 to FIG. 14 are schematic diagrams illustrating a self-aligned method for forming a hetero-junction bipolar transistor (HBT) according to the second embodiment of the present invention.
Figure 13:
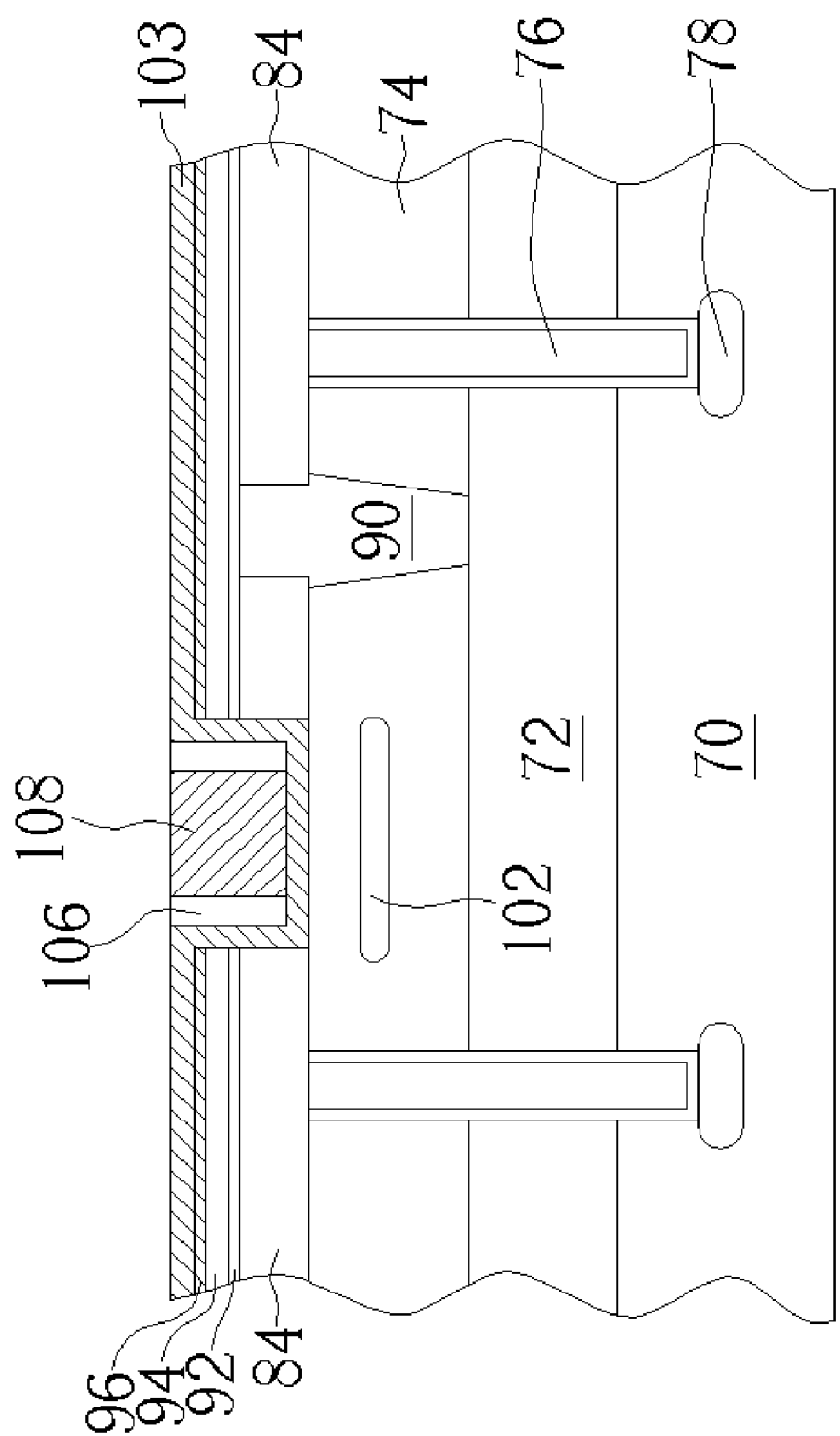
Figure 14:
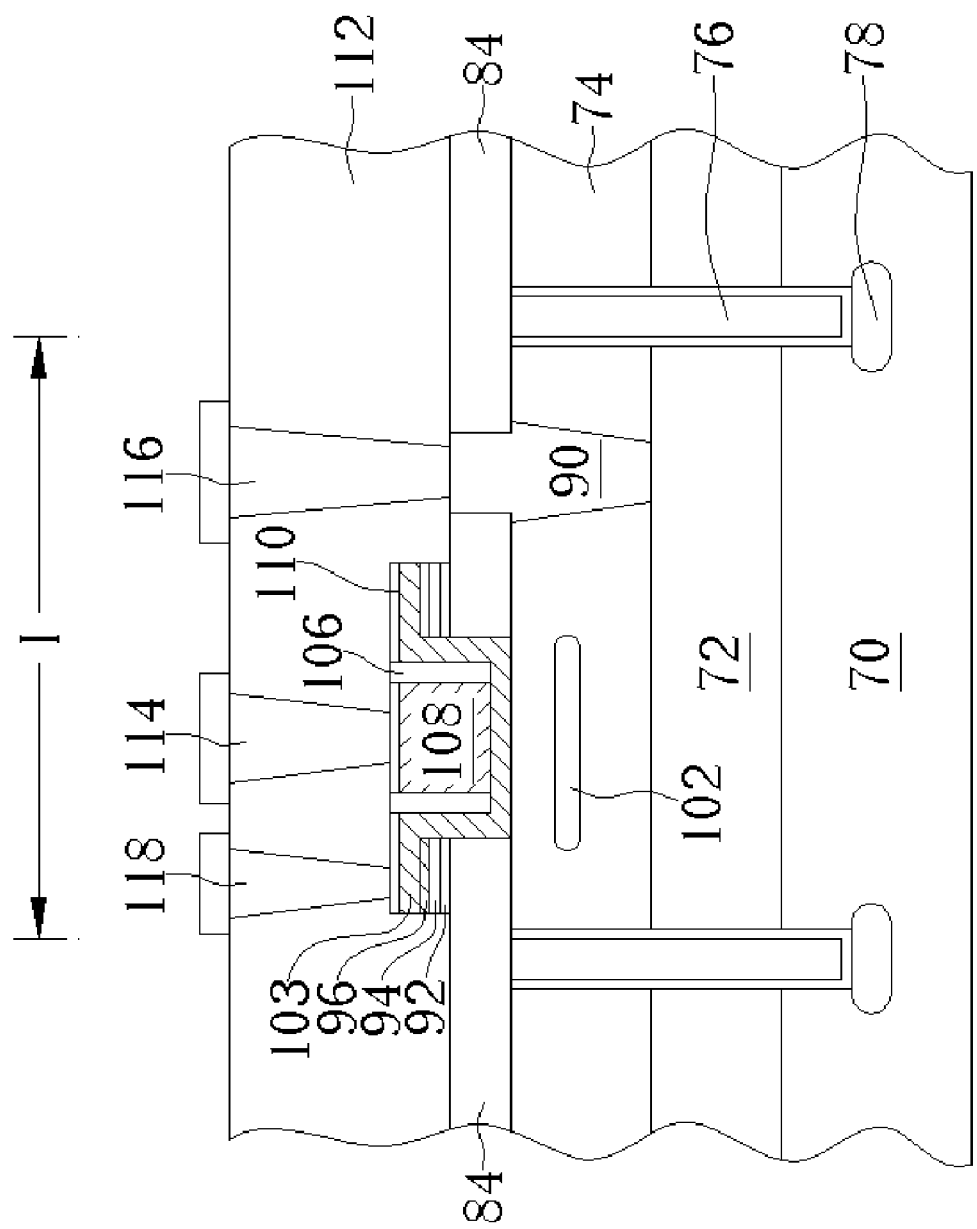

Please refer to FIG. 12 to FIG. 14, which are schematic diagrams illustrating a method for forming a hetero-junction bipolar transistor (HBT) according to the second embodiment of the present invention. As shown in FIG. 12, the HBT of the present invention is fabricated on a P-type semiconductor substrate 70 having an active region I. An N+ buried layer 72 and an N-type non-selective epitaxial layer 74 are formed on the substrate 70, respectively. First, a deep isolation trench is formed two sides of the active region I. Then, a dielectric layer 84 is formed on the epitaxial layer 74. A collector contact hole 86 is formed in the dielectric layer 84, and an undoped polysilicon layer 88 is filled with the collector contact hole 86. Further, an ion implantation process is performed to implant P ions into the exposed undoped polysilicon layer 88 and a thermal treatment process is performed to drive the P ions into the epitaxial layer 74 to form an N+ collector contact region 90 beneath the undoped polysilicon layer 88. A silicon dioxide layer 92, a silicon nitride layer 94, and an in-situ doped P-type polysilicon layer 96 are formed on the dielectric layer 84, respectively. A patterned photoresist layer (not shown in FIG. 12) is formed on the polysilicon layer 96, and a photolithographic and etching process is performed to form an opening 98 in the polysilicon layer 96 to expose a portion of the epitaxial layer 74. A selective ion implantation process 100 is performed to form a SIC 102 in the exposed epitaxial layer 74 and in the bottom of the opening 98. The in-situ doped P-type polysilicon layer 96 is used as an extrinsic base of the BJT for controlling the electrode voltage of the BJT.

As shown in FIG. 13, a P-type SiGe epitaxial layer 103, which covers a sidewall and a bottom of the opening 98, is deposited on the substrate 70. Selectively, the SiGe epitaxial layer 103, functioning as a P-type intrinsic base, can be replaced by a semiconductor layer formed of group IIIA-VA compounds. For example, the SiGe epitaxial layer 103 can be replaced by a semiconductor layer comprises at least one material selected from a material group consisting of GaAs, InP and AlGaAs. Furthermore, the SiGe epitaxial layer 103 can also be replaced by a silicon epitaxial layer in a silicon bipolar junction transistor.

Following that, a spacer 106 is formed on the SiGe epitaxial layer 103 in the opening 98 to define a self-aligned emitter region in the opening 98. Then, an emitter conductivity layer 108, such as an N-type polysilicon layer, is filled with the self-aligned emitter region, and a PN junction is formed between the emitter conductivity layer 108 and the SiGe epitaxial layer 103 (intrinsic base).

As shown in FIG. 14, an etching back process is performed to remove a portion of the emitter conductivity layer 108 and the SiGe epitaxial layer 103. The polysilicon layer 96, the silicon nitride layer 94 and the oxide layer 92 are patterned. A salicide layer 110 is formed on the emitter conductivity layer 108 and on the portion of the P-type SiGe epitaxial layer 103 outside of the opening 98 and above the dielectric layer 84. Finally, an interlayer dielectric layer 112 is formed on the substrate 70, and metal contacts 114, 116 and 118 are formed on the emitter conductivity layer 108, the collector contact region 90, and the extrinsic base region 96, and the HBT of the present invention is completed.

To sum up, the present invention utilizes the heavily doped polysilicon layer 104 to define the self-aligned base region in the opening 98 to form the intrinsic base doped region 105. Further, the present invention utilizes the spacer 106 formed on the heavily doped polysilicon layer 104 to define the self-aligned emitter region in the opening 98, and then the emitter conductivity layer is filled with the self-aligned emitter region to form the self-aligned emitter region 108. Accordingly, only one opening 98 is formed, the emitter region 108, the base region 105 and the collector region 102 of the BJT with small size and high operating efficiency can be formed by using the self-aligned method of the present invention. In addition, the extrinsic base region 96 is composed of the in-situ polysilicon layer, so that the thermal diffusion process does not have to use to form the extrinsic base region 96. Therefore, the contact area between the base region 105 and the collector region 102 can be controlled precisely, thus reducing the junction capacitance between the collector region 102 beneath the extrinsic base region 96 and the base region 105. Furthermore, after formation of the SiGe epitaxial layer 103, no thermal diffusion process with high temperature is used, so that the self-aligned method of the present invention is suitable for forming the HBT.

In contrast to the prior art method for forming the BJT, the present invention does not have to use the thermal diffusion process with high temperature to form the extrinsic base region. Therefore, the self-aligned method of the present invention is not only suitable for forming the BJT, bit also for forming the emitter region, base region, and the collector region of the HBT, thus simplifying processes and reducing cost.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A bipolar junction transistor, comprising:
   a substrate;
   a dielectric layer formed on the substrate;
   an opening formed in the dielectric layer to expose a portion of the substrate;
   a semiconductor layer formed on a sidewall and a bottom of the opening, the semiconductor layer extending outside the opening and above the dielectric layer;
   a spacer formed on the semiconductor layer to define a self-aligned emitter region in the opening;
   an emitter conductivity layer being filled into the self-aligned emitter region, and a PN junction being formed between the emitter conductivity layer and the semiconductor layer; and
   a salicide layer formed on the emitter conductivity layer and on the portion of the semiconductor layer extending outside the opening and above the dielectric layer.

2. The bipolar junction transistor of claim 1, wherein the semiconductor layer comprises at least one material selected from a material group consisting of silicon epitaxy, GaAs, InP and AlGaAs.

3. The bipolar junction transistor of claim 1, further comprising a selective implant collector region formed in the substrate beneath the semiconductor layer.

4. The bipolar junction transistor of claim 1, further comprising an extended conductivity layer formed on the dielectric layer to connect to the semiconductor layer.

5. The bipolar junction transistor of claim 4, further comprising an oxide layer and a silicon nitride layer formed between the extended conductivity layer and the dielectric layer.

6. The bipolar junction transistor of claim 4, wherein the extended conductivity layer is composed of polysilicon.

7. A hetero-junction bipolar junction transistor, comprising:
   a substrate;
   a dielectric layer formed on the substrate;
   an opening formed in the dielectric layer to expose a portion of the substrate;
   a GaAs layer formed on a sidewall and a bottom of the opening;
   a spacer formed on the GaAs layer to define a self-aligned emitter region in the opening; and
   an emitter conductivity layer being filled into the self-aligned emitter region, and a PN junction being formed between the emitter conductivity layer and the GaAs layer.

8. The hetero-junction bipolar junction transistor of claim 7, further comprising a selective implant collector region formed in the substrate beneath the GaAs layer.

9. The hetero-junction bipolar junction transistor of claim 7, wherein the GaAs layer extends outside the opening and above the dielectric layer.

10. The hetero-junction bipolar junction transistor of claim 9, further comprising a salicide layer formed on the emitter conductivity layer and on the portion of the GaAs layer extending outside the opening and above the dielectric layer.

11. The hetero-junction bipolar junction transistor of claim 7, further comprising an extended conductivity layer formed on the dielectric layer to connect to the GaAs layer.

12. The hetero-junction bipolar junction transistor of claim 11, further comprising an oxide layer and a silicon nitride layer formed between the extended conductivity layer and the dielectric layer.

13. The hetero-junction bipolar junction transistor of claim 11, wherein the extended conductivity layer is composed of polysilicon.

14. A hetero-junction bipolar junction transistor, comprising:
   a substrate;
   a dielectric layer formed on the substrate;
   an opening formed in the dielectric layer to expose a portion of the substrate;
   a InP layer formed on a sidewall and a bottom of the opening;
   a spacer formed on the LnP layer to define a self-aligned emitter region in the opening; and
   an emitter conductivity layer being filled into the self-aligned emitter region, and a PN junction being formed between the emitter conductivity layer and the InP layer.

15. The hetero-junction bipolar junction transistor of claim 14, further comprising a selective implant collector region formed in the substrate beneath the InP layer.

16. The hetero-junction bipolar junction transistor of claim 14, wherein the InP layer extends outside the opening and above the dielectric layer.

17. The hetero-junction bipolar junction transistor of claim 16, further comprising a salicide layer formed on the emitter conductivity layer and on the portion of the InP layer extending outside the opening and above the dielectric layer.

18. The hetero-junction bipolar junction transistor of claim 14, further comprising an extended conductivity layer formed on the dielectric layer to connect to the InP layer.

19. The hetero-junction bipolar junction transistor of claim 18, further comprising an oxide layer and a silicon nitride layer formed between the extended conductivity layer and the dielectric layer.

20. The hetero-junction bipolar junction transistor of claim 18, wherein the extended conductivity layer is composed of polysilicon.

21. A hetero-junction bipolar junction transistor, comprising:
   a substrate;
   a dielectric layer formed on the substrate;
   an opening formed in the dielectric layer to expose a portion of the substrate;
   an AlGaAs layer formed on a sidewall and a bottom of the opening;
   a spacer formed on the AlGaAs layer to define a self-aligned emitter region in the opening; and
   an emitter conductivity layer being filled into the self-aligned emitter region, and a PN junction being formed between the emitter conductivity layer and the AlGaAs layer.

22. The hetero-junction bipolar junction transistor of claim 21, further comprising a selective implant collector region formed in the substrate beneath the AlGaAs layer.

23. The hetero-junction bipolar junction transistor of claim 21, wherein the AlGaAs layer extends outside the opening and above the dielectric layer.

24. The hetero-junction bipolar junction transistor of claim 23, further comprising a salicide layer formed on the emitter conductivity layer and on the portion of the AlGaAs layer extending outside the opening and above the dielectric layer.

25. The hetero-junction bipolar junction transistor of claim 21, further comprising an extended conductivity layer formed on the dielectric layer to connect to the AlGaAs layer.

26. The hetero-junction bipolar junction transistor of claim 25, further comprising an oxide layer and a silicon nitride layer formed between the extended conductivity layer and the dielectric layer.

27. The hetero-junction bipolar junction transistor of claim 25, wherein the extended conductivity layer is composed of polysilicon.

* * * * *